(12) United States Patent
Chung

(10) Patent No.: US 8,367,564 B2
(45) Date of Patent: Feb. 5, 2013

(54) CRYSTALLIZATION METHOD OF AMORPHOUS SILICON LAYER

(75) Inventor: In-Do Chung, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 75 days.

(21) Appl. No.: 13/046,641

(22) Filed: Mar. 11, 2011

(65) Prior Publication Data

US 2011/0223775 A1 Sep. 15, 2011

(30) Foreign Application Priority Data

Mar. 12, 2010 (KR) .................. 10-2010-0022446

(51) Int. Cl.
*H01L 21/268* (2006.01)
(52) U.S. Cl. .................. 438/795; 257/E21.347
(58) Field of Classification Search .............. 438/96, 438/97, 478, 482, 486, 488, 795
See application file for complete search history.

(56) References Cited

FOREIGN PATENT DOCUMENTS

| JP | 2001-332493 A | 11/2001 |
|---|---|---|
| KR | 10-0525443 B1 | 10/2005 |
| KR | 10-2005-0121548 A | 12/2005 |
| KR | 10-0700179 B1 | 3/2007 |

OTHER PUBLICATIONS

Korean Office Action dated May 26, 2011 for Korean Patent Application No. KR 10-2010-0022446 which corresponds to captioned U.S. Appl. No. 13/046,641.

*Primary Examiner* — Savitr Mulpuri
(74) *Attorney, Agent, or Firm* — Knobbe Martens Olson & Bear LLP

(57) ABSTRACT

A crystallization method is disclosed. In one embodiment, the method includes providing a substrate having an amorphous silicon layer, wherein the substate has first and second sides opposing each other and irradiating a laser beam onto the substrate so as to have an inclined angle with respect to the first and second sides of the substrate. The method further includes relatively moving one of the laser beam and the substate with respect to the other i) in a first direction from the first side to the second side of the substate and ii) in a second direction which crosses the first direction.

14 Claims, 4 Drawing Sheets

(a)

(b)

(c)

(d)

CRYSTALLIZATION METHOD OF AMORPHOUS SILICON LAYER

RELATED APPLICATIONS

This application claims priority to and the benefit of Korean Patent Application No. 10-2010-0022446 filed in the Korean Intellectual Property Office on Mar. 12, 2010, the entire content of which is incorporated herein by reference.

BACKGROUND

1. Field

The described technology generally relates to a crystallization method of an amorphous silicon layer, and more particularly, to a crystallization method of an amorphous silicon layer by laser irradiation.

2. Description of the Related Technology

Flat panel displays such as an active matrix-type liquid crystal display and an organic light emitting display have thin-film transistors (TFTs). A poly-crystal silicon layer having good field-effect mobility and good stability to temperature and light is generally used as a semiconductor layer or substrate on which the TFTs are formed.

SUMMARY

One inventive aspect is a crystallization method of an amorphous silicon layer capable of improving crystallization characteristics and efficiency.

Another aspect is a crystallization method that relates to a sequential lateral solidification method in which a laser beam is relatively moved in a first direction from a first side to a second side with respect to a substrate with an amorphous silicon layer, which has the first side and the second side opposite to each other and a first end and a second end opposite to each other while intersecting the first side and the second side. Herein, the laser beam is irradiated to have an inclined angle with the first side and the second side of the substrate and when the laser beam is relatively moved in the first direction with respect to the substrate, the laser beam is relatively moved even in a second direction intersecting the first direction.

The laser beam may have a first end and a second end in the second direction. At this time, when the laser beam is irradiated to the first side of the substrate, the first end of the laser beam may coincide with the first end of the substrate and when the laser beam is irradiated to the second side of the substrate, the second end of the laser beam may coincide with the second end of the substrate.

The substrate and the laser beam may be relatively moved in the first and second directions in succession.

A relative movement velocity V of the laser beam in the second direction with respect to the substrate may meet the following equation.

$$V = \frac{C - \sqrt{C^2 + D^2} \cdot \cos(\alpha + \theta)}{\dfrac{D}{A \times B}}$$

Herein, C represents a length of the first side or the second side of the substrate and D represents a length of the first end or the second end of the substrate. α represents an angle which an oblique line of the substrate forms with the first side of the substrate and θ represents an inclined angle which the first side of the substrate forms with the laser beam. A represents a scan pitch SC [nm] of the laser beam and B represents a frequency of the laser beam.

The substrate and the laser beam may be relatively moved by movement of the substrate or the laser beam.

The first direction and the second direction may be perpendicular to each other.

The laser beam may be two dimensional and extend lengthwise in the second direction and an additional mask may not be used in the crystallization method of the embodiment. The length of the 2D laser beam may be equal to at least one of the lengths of the first and second sides of the substrate. Another aspect is a crystallization method using a sequential lateral solidification process, the method comprising: providing a substrate having an amorphous silicon layer, wherein the substate has first and second sides opposing each other; and irradiating a laser beam onto the substrate so as to have an inclined angle with respect to the first and second sides of the substrate; and relatively moving one of the laser beam and the substate with respect to the other i) in a first direction from the first side to the second side of the substate and ii) in a second direction which crosses the first direction.

In the above method, the laser beam has a first end and a second end opposing each other and formed along the second direction, wherein the substrate has third and fourth sides each substantially perpendicularly connected to the first and second sides, wherein the third side has a lower end, wherein the fourth side has an upper end, and wherein the lower end and upper end of the substrate are substantially diagonally arranged with respect to each other, wherein when the laser beam is irradiated toward the first side of the substrate, the first end of the laser beam coincides with the lower end of the substrate, and wherein when the laser beam is irradiated toward the second side of the substrate, the second end of the laser beam coincides with the upper end of the substrate. In the above method, the substrate and the laser beam are relatively moved in the first and second directions in succession.

In the above method, the substrate has third and fourth sides each substantially perpendicularly arranged with the first and second sides, wherein the third side has a lower end, wherein the fourth side has an upper end, and wherein the lower end and upper end of the substrate are substantially diagonally arranged with respect to each other, and wherein a relative movement velocity V of the laser beam in the second direction with respect to the substrate satisfies the following equation:

$$V = \frac{C - \sqrt{C^2 + D^2} \cdot \cos(\alpha + \theta)}{\dfrac{D}{A \times B}}$$

wherein C represents the length of the first side or the second side of the substrate and D represents the length of the third side or fourth side of the substrate, wherein α represents an angle which an oblique line of the substrate forms with respect to the first side of the substrate and θ represents an inclined angle which the first side of the substrate forms with respect to the laser beam, and wherein A represents a scan pitch SC [nm] of the laser beam and B represents a frequency of the laser beam.

In the above method, the relative movement is performed by moving only the substrate. In the above method, the relative movement is performed by moving only the laser beam. In the above method, the first direction and the second direction are substantially perpendicular to each other.

In the above method, the laser beam has a width and a length which is significantly greater than the width, and wherein the length of the laser beam extends in the second direction. In the above method, a pattern mask is not used in the crystallization method. In the above method, the length of the laser beam is substantially equal to at least one of the lengths of the first and second sides of the substrate.

Another aspect is a crystallization method comprising: providing a substrate having an amorphous silicon layer, wherein the substate has first and second sides opposing each other; irradiating a laser beam onto the substrate, wherein the laser beam has a width and a length which is significantly greater than the width, and wherein the length direction of the laser beam forms an inclined angle with respect to the first and second sides of the substrate; first moving at least one of the laser beam and the substrate in a first direction; and second moving at least one of the laser beam and the substrate in a second direction which crosses the first direction.

The above method further comprises repeating the first moving and second moving until the amorphous silicon layer is substantially completely crystallized. In the above method, the second moving is substantially continuously performed with respect to the first moving. In the above method, the first moving and second moving are performed in a stepwise manner. In the above method, both of the laser beam and substate are moved in at least one of the first and second moving.

In the above method, the substrate has third and fourth sides each substantially perpendicularly arranged with the first and second sides, wherein the third side has a lower end, wherein the fourth side has an upper end, wherein the lower end and upper end of the substrate are substantially diagonally arranged with respect to each other, and wherein a relative movement velocity V of the laser beam in the second direction with respect to the substrate satisfies the following equation:

$$V = \frac{C - \sqrt{C^2 + D^2} \cdot \cos(\alpha + \theta)}{\frac{D}{A \times B}}$$

wherein C represents the length of the first side or the second side of the substrate and D represents the length of the third side or fourth side of the substrate, wherein α represents an angle which an oblique line of the substrate forms with respect to the first side of the substrate and θ represents an inclined angle which the first side of the substrate forms with respect to the laser beam, and wherein A represents a scan pitch SC [nm] of the laser beam and B represents a frequency of the laser beam.

Another aspect is a crystallization system, comprising: a laser generator configured to irradiate a laser beam onto a surface of a substrate having an amorphous silicon layer so as to have an inclined angle with respect to first and second sides of the substrate; and a substrate holding device, wherein at least one of the laser generator and the substrate holding device is configured to relatively move the laser beam and substrate i) in a first direction and ii) in a second direction which crosses the first direction such that the entire surface of the substrate is irradiated by the laser generator.

In the above system, only the laser generator is configured to i) move the laser beam in the first and second directions. In the above system, only the substrate holding device is configured to move the substate in the first and second directions. In the above system, the system does not require a pattern mask.

DETAILED DESCRIPTION

Figure 1:
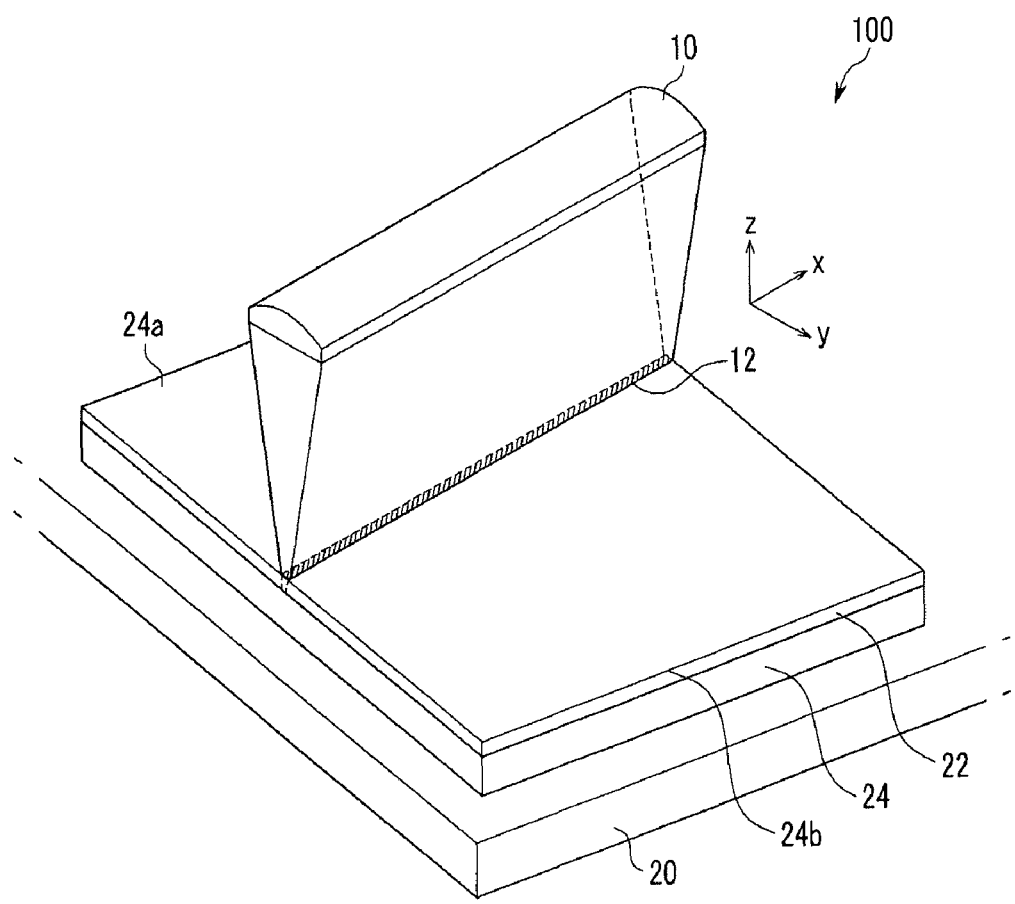
FIG. 1 is a perspective view schematically showing a crystallization device used in a crystallization method of an amorphous silicon layer according to an exemplary embodiment.

A polycrystal silicon layer may be formed by crystallizing an amorphous silicon layer. A laser process that includes irradiating a laser beam is being widely used for crystallization. For example, an eximer laser annealing (ELA) method to momentarily irradiate an eximer laser (a high-output pulse laser) or a sequential lateral solidification (SLS) method to induce a side growth of silicon crystal may be used for this purpose.

In the sequential lateral solidification method, a laser beam providing sufficient energy to melt silicon into a liquefied state is irradiated through a slit formed in a mask to allow lateral growth of silicon crystals. These crystals grow in directions opposite to each other and meet to form a protrusion. This protrusion operates as a slit for interference and diffraction of light. A moiré effect may result which produces undesirable display defects such as a wave pattern and/or oblique stains. As a result, the image quality of the display device may be compromised.

Embodiments will be described more fully hereinafter with reference to the accompanying drawings. As those skilled in the art would realize, the described embodiments may be modified in various different ways. The drawings and description are to be regarded as illustrative in nature and not restrictive. Like reference numerals designate like elements throughout the specification. Further, in the drawings, for better comprehension and ease of description, the sizes of elements are arbitrarily expressed.

Hereinafter, a crystallization method of an amorphous silicon layer according to an exemplary embodiment will be described with reference to FIGS. 1 to 4.

FIG. 1 is a perspective view schematically showing a crystallization device used in a crystallization method of an amorphous silicon layer according to an exemplary embodiment.

As shown in FIG. 1, a crystallization device 100 includes a laser generator 10 emitting a laser beam and a stage 20 on which a substrate 24 having an amorphous silicon layer 22 where crystallization will be made is positioned. For clear description, a general configuration not directly related with the embodiment is not illustrated and described.

In one embodiment, the laser generator 10 may generate a laser beam 12 of a line type having a small width and a large length. For example, the laser generator 10 may use xenon fluoride (XeF) gas.

The substrate 24 with the amorphous silicon layer 22 is fixed to the stage positioned below the laser generator 10 to have a plane substantially vertical to the laser beam 12. That is, referring to FIG. 1, the laser beam 12 is irradiated in a z-axis direction and the substrate 24 has an xy plane substantially vertical to the irradiation direction of the laser beam 12. At this time, the line-type laser beam 12 may have a line type having a narrow width in a y-axis direction (hereinafter, referred to as "first direction") of FIG. 1 and a long length in an x-axis direction (hereinafter, referred to as "second direction") of FIG. 1.

In one embodiment, the stage 20 may arbitrarily move in the first direction and the second direction by a moving device or a substrate holding device (not shown). In this embodiment, the laser generator 10 may or may not move with respect to the stage 20 as long as the substrate 24 and the laser beam 12 are relatively moved with respect to each other. The moving device may have a known configuration to arbitrarily move in the stage 20 on the plane. For example, as the moving device, a driving actuator, etc., may be used.

The crystallization method of the amorphous silicon layer according to the FIG. 1 embodiment using the above-mentioned crystallization device 100 will be described in more detail with reference to FIGS. 2 and 3.

Figure 2:
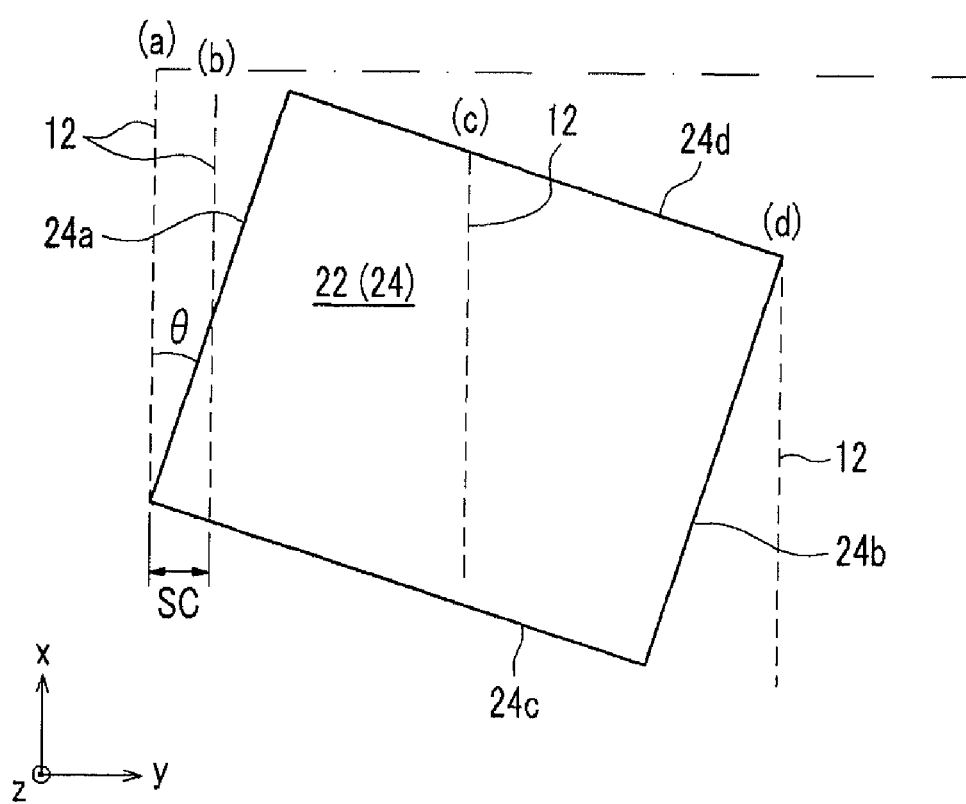
FIG. 2 is a plan view schematically illustrating a relative position of a laser beam on the basis of a substrate with an amorphous silicon layer in a crystallization method of the amorphous silicon layer according to an embodiment.

FIG. 2 is a plan view schematically illustrating a relative position of a laser beam on the basis of a substrate having an amorphous silicon layer in a crystallization method of the amorphous silicon layer according to an embodiment.

In one embodiment, the amorphous silicon layer 22 is crystallized by an advanced sequential lateral solidification (ASLS) method.

That is, as shown in (a) of FIG. 2, the laser beam 12 having the energy intensity of a complete melted region is irradiated to a first side (hereinafter, interchangeably used with "left side") 24*a* of the substrate 24. When the laser beam 12 is irradiated, amorphous silicon in this region is melted and a crystal grain laterally grows toward an irradiation region of the laser beam 12 from an interface of the liquidized silicon region. At this time, the side growth of the crystal grain is made in a direction substantially vertical to the interface of the liquidized silicon region. Crystal grains at both sides that grow substantially vertically inward from interfaces at both sides of the irradiation region of the laser beam 12 collide with each other at a middle point and stop to grow to thereby form a protrusion.

In one embodiment, as shown in (b) of FIG. 2, the laser beam 12 is irradiated while relatively moving in the first direction (the y-axis direction of the figure) by a scan pitch SC with respect to the substrate 24 so as to crystallize the amorphous silicon. For a clear description, in FIG. 2, the scan pitch SC is enlarged.

As such, by repetitively performing the process of relatively moving and irradiating the laser beam 12 with respect to the substrate by the scan pitch SC, as shown in (c) and (d) of FIG. 2, the amorphous silicon layer 22 is crystallized all the way to a second side 24*b* (hereinafter, interchangeably used with "a right side") of the substrate 24.

In one embodiment, since the sequential lateral solidification method is adopted without a pattern mask by using the line-type laser beam 12, it is possible to simplify the process and reduce manufacturing costs.

Furthermore, in one embodiment, while the laser beam 12 is relatively moved in the first direction (the y-axis direction of FIG. 2) with respect to the substrate 24, the laser beam 12 is also relatively moved in a second direction (an x-axis direction of FIG. 2) to improve crystallization characteristics. It will be described in more detail with reference to FIG. 3.

Figure 3:
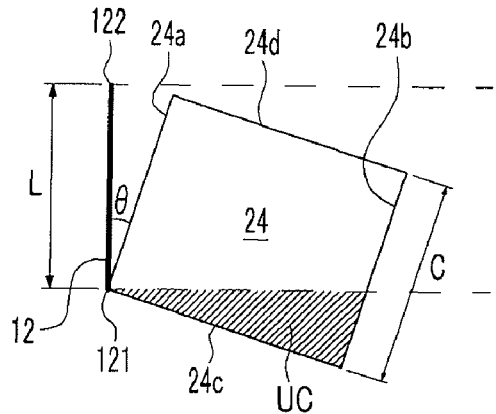
FIG. 3 is a plan view schematically illustrating a relative position of a substrate on the basis of a laser beam in a crystallization method of an amorphous silicon layer according to an exemplary embodiment.
Figure 3:
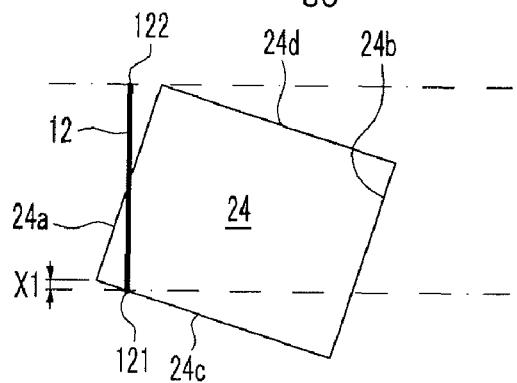
Figure 3:
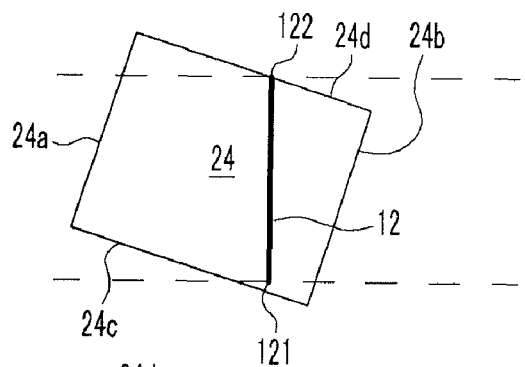
Figure 3:
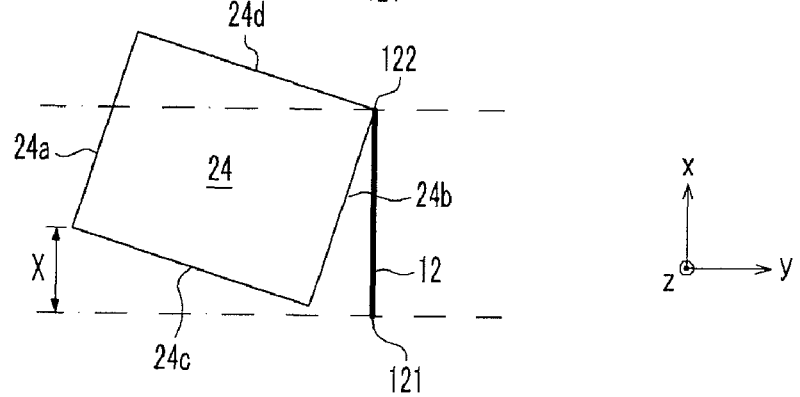

FIG. 3 is a plan view schematically illustrating a relative position of a substrate on the basis of a laser beam in a crystallization method of an amorphous silicon layer according to an exemplary embodiment. More specifically, the states of (a)-(d) of FIG. 3 correspond to the states of (a)-(d) of FIG. 2, respectively.

As shown in FIGS. 2 and 3, in one embodiment, when the laser beam 12 is irradiated to the substrate 24, the laser beam 12 forms a predetermined angle θ with respect to the left side 24*a* of the substrate 24. When the laser beam 12 is irradiated to have the inclined angle θ, the protrusions formed while the side-growing crystals meet at the middle point are irregularly arranged, thereby minimizing display defects caused by a moire phenomenon.

Meanwhile, in one embodiment, as shown in FIG. 3, a length L of the laser beam 12 and lengths C of the left side 24*a* and the right side 24*b* of the substrate 24 are substantially equal to each other to thereby maximize the size of the substrate 24 to be crystallized using the laser beam 12.

However, as described above, in the case in which the laser beam 12 forms the inclined angle θ with respect to the left side 24*a* of the substrate 24, when the laser beam 12 is not moved in the second direction with respect to the substrate 24, an uncrystallized region as large as a region reference numeral UC of FIG. 3A may be generated. For example, when the inclined angles θ are about 2°, about 4°, and about 8°, ratios of the uncrystallized regions are about 4.5%, about 8.9%, and about 17.8%, respectively. As such, when the inclined angle θ is formed in order to prevent or minimize the moiré phenomenon, and the oblique stain and other defects generated by the phenomenon, crystallization efficiency may be reduced by the uncrystallized region. Therefore, in one embodiment, the laser beam 12 is also relatively moved in the second direction with respect to the substrate 24 to remove the uncrystallized region.

In one embodiment, as shown in (a) of FIG. 2 and (a) of FIG. 3, when the laser beam 12 is irradiated to the left side 24*a* of the substrate 24, a first end 121 (hereinafter, interchangeably used with "a lower end") of the laser beam 12 coincides with a first end (hereinafter, interchangeably used with "a lower end") of a third side 24*c* of the substrate 24.

In one embodiment, as shown in FIG. 2B and FIG. 3B, when the laser beam 12 is relatively moved in the first direction with respect to the substrate 24 by the scan pitch SC, the laser beam 12 is also relatively moved in the second direction by a first interval X1.

In one embodiment, by relatively moving the laser beam in the second direction with respect to the substrate 24 by the first interval X1 in succession, as shown in (c) of FIG. 2 and (c) of FIG. 3, when the laser beam 12 is irradiated to the right side 24*b* of the substrate 24 as shown in (d) of FIG. 2 and (d) of FIG. 3, a second end (hereinafter, referred to as "an upper end") 122 of the laser beam 12 coincides with a second end (hereinafter, referred to as "an upper end") of a fourth side 24*d* of the substrate 24. In one embodiment, as shown in (a) and (d) of FIG. 3, the first end of the third side 24*c* is substantially diagonally arranged with respect to the second end of the fourth side 24*d*.

When the lower end 121 of the laser beam 12 coincides with the lower end 24*c* of the substrate 24 at the left side 24*a* of the substrate 24 where the crystallization starts and the upper end 122 of the laser beam 12 coincides with the upper end 24*d* of the substrate 24 at the right side 24*b* of the substrate 24 where the crystallization ends, the entire region of the amorphous silicon layer 22 formed on the substrate 24 can be crystallized without an uncrystallized region.

In one embodiment, while the laser beam 12 is irradiated at the inclined angle θ formed with respect to the substrate 24 to substantially remove the moiré phenomenon and the resulting display defects such as oblique stains, the laser beam 12 is also relatively moved in the second direction with respect to the substrate 24 so as to prevent the uncrystallized region from being generated. As a result, it is possible to improve the crystallization characteristics and in addition, it is possible to improve the crystallization efficiency by removing the uncrystallized region.

In one embodiment, in order to relatively move the laser beam 12 in the first direction and the second direction with respect to the substrate 24, the stage (reference numeral 20 of FIG. 1, hereinafter, the same as above) where the substrate 24 is positioned is moved by the moving device. In another embodiment, while the substrate 24 is fixed, the laser beam 12 may move in the first direction and the second direction. In still another embodiment, both the laser beam 12 and substrate 24 may be moved with respect to each other.

In addition, in one embodiment, the laser beam 12 may be relatively moved with respect to the substrate 24 in succession. That is, by moving the stage 20 where the substrate 24 is positioned in the first direction and the second direction at a predetermined velocity, it is possible to adjust the relative positions of the laser beam 12 and the substrate 24.

Figure 4:
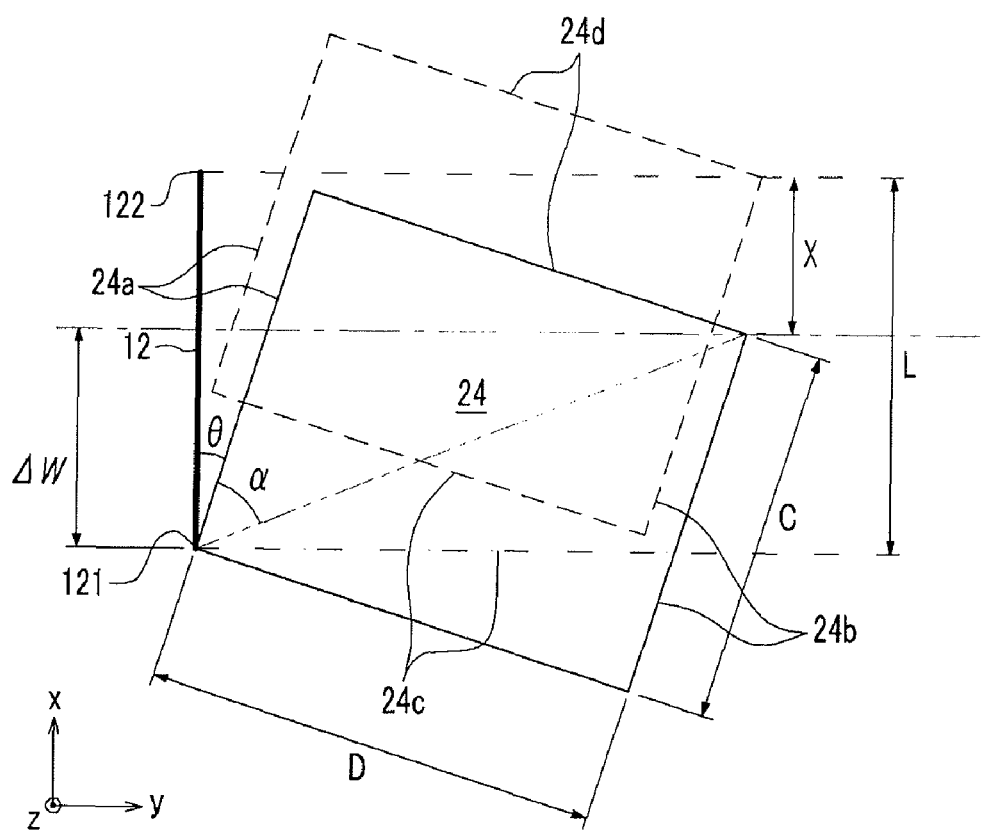
FIG. 4 is a diagram for describing relative movement velocities of a laser beam and a substrate in a second direction in a crystallization method of an amorphous silicon layer according to an exemplary embodiment.

In one embodiment, a relative movement velocity of the substrate 24 in the second direction with respect to the laser beam 12 will be described with reference to FIG. 4. FIG. 4 is a diagram for describing a relative movement velocity of a substrate in a second direction with respect a laser beam in the second direction. In FIG. 4, a substrate 24 marked with by a solid line represents a time when the crystallization is started and a substrate 24 marked with a dotted line represents a time when the crystallization is completed.

The relative movement velocity of the substrate 24 in the second direction with respect to the laser beam 12 may be acquired by dividing relative movement distances X of the laser beam 12 and the substrate 24 in the second direction by the time required. Referring to FIG. 4, the relative movement distance X in the second direction is substantially equal to a distance between the upper end 122 of the laser beam 12 and the upper end 24d of the right side 24b of the substrate 24. The relative movement distance X may be acquired by subtracting reference numeral ΔW of FIG. 4 from the length L of the laser beam 12, that is, the length C of the left side 24a or the right side 24b of the substrate 24. Therefore, the relative movement distance X in the second direction is shown in Equation 1.

$$X = C - \sqrt{C^2 + D^2} \cdot \cos(\alpha + \theta) \quad \text{(Equation 1)}$$

(where C represents the length of the left side 24a or the right side 24b of the substrate 24 and D represents the length of the upper end or the lower end of the substrate 24. α represents an angle which an oblique line of the substrate 24 forms with respect to the left side 24a of the substrate 24 and θ represents an inclined angle of the left side 24a of the substrate 24 with respect to the laser beam 12.)

In addition, a time T required to move the relative movement distance X is given by Equation 2.

$$T = \frac{D}{A \times B} \quad \text{(Equation 2)}$$

where A represents the scan pitch SC [nm] of the laser beam and B represents a frequency of the laser beam.)

Therefore, a relative movement velocity V of the substrate 24 in the second direction with respect to the laser beam 12 is given by the following equation.

$$V = \frac{C - \sqrt{C^2 + D^2} \cdot \cos(\alpha + \theta)}{\frac{D}{A \times B}} \quad \text{(Equation 3)}$$

In one embodiment, the stage 20 may be stepwise moved considering the time when the laser beam 12 is irradiated. In one embodiment, the length L of the laser beam 12 may be slightly different from the length C of the left side 24a or the right side 24b of the substrate 24.

According to at least one embodiment, a crystallization method can substantially remove a moire phenomenon and resulting display defects such as oblique stains and/or a wave pattern by irradiating a laser beam to have an inclined angle with respect to a substrate and prevent an uncrystallized region by relatively moving the laser beam in a first direction and a second direction with respect to the substrate. As a result, it is possible to improve crystallization characteristics and in addition, it is possible to improve crystallization efficiency by removing the uncrystallized region.

Further, the crystallization method does not use a pattern mask which can simplify a manufacturing process and reduce manufacturing costs.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A crystallization method using a sequential lateral solidification process, the method comprising:
    providing a substrate having an amorphous silicon layer, wherein the substrate has first and second sides opposing each other; and
    irradiating a laser beam onto the substrate so as to have an inclined angle with respect to the first and second sides of the substrate; and
    relatively moving one of the laser beam and the substrate with respect to the other i) in a first direction from the first side to the second side of the substrate and ii) in a second direction which crosses the first direction,
    wherein the substrate has third and fourth sides each substantially perpendicularly arranged with the first and second sides, wherein the third side has a lower end, wherein the fourth side has an upper end, and wherein the lower end and upper end of the substrate are substantially diagonally arranged with respect to each other, and wherein a relative movement velocity V of the laser beam in the second direction with respect to the substrate satisfies the following equation:

$$V = \frac{C - \sqrt{C^2 + D^2} \cdot \cos(\alpha + \theta)}{\frac{D}{A \times B}}$$

wherein C represents the length of the first side or the second side of the substrate and D represents the length of the third side or fourth side of the substrate, wherein α represents an angle which an oblique line of the substrate forms with respect to the first side of the substrate and θ represents an inclined angle which the first side of the substrate forms with respect to the laser beam, and wherein A represents a scan pitch SC [nm] of the laser beam and B represents a frequency of the laser beam.

2. The crystallization method of claim 1, wherein the laser beam has a first end and a second end opposing each other and formed along the second direction,
wherein when the laser beam is irradiated toward the first side of the substrate, the first end of the laser beam coincides with the lower end of the substrate, and
wherein when the laser beam is irradiated toward the second side of the substrate, the second end of the laser beam coincides with the upper end of the substrate.

3. The crystallization method of claim 1, wherein the substrate and the laser beam are relatively moved in the first and second directions in succession.

4. The crystallization method of claim 1, wherein the relative movement is performed by moving only the substrate.

5. The crystallization method of claim 1, wherein the relative movement is performed by moving only the laser beam.

6. The crystallization method of claim 1, wherein the first direction and the second direction are substantially perpendicular to each other.

7. The crystallization method of claim 1, wherein the laser beam has a width and a length which is significantly greater than the width, and wherein the length of the laser beam extends in the second direction.

8. The crystallization method of claim 7, wherein a pattern mask is not used in the crystallization method.

9. The crystallization method of claim 7, wherein the length of the laser beam is substantially equal to at least one of the lengths of the first and second sides of the substrate.

10. A crystallization method comprising:
providing a substrate having an amorphous silicon layer, wherein the substrate has first and second sides opposing each other;
irradiating a laser beam onto the substrate, wherein the laser beam has a width and a length which is significantly greater than the width, and wherein the length direction of the laser beam forms an inclined angle with respect to the first and second sides of the substrate;
first moving at least one of the laser beam and the substrate in a first direction; and
second moving at least one of the laser beam and the substrate in a second direction which crosses the first direction,
wherein the substrate has third and fourth sides each substantially perpendicularly arranged with the first and second sides, wherein the third side has a lower end, wherein the fourth side has an upper end, wherein the lower end and upper end of the substrate are substantially diagonally arranged with respect to each other, and wherein a relative movement velocity V of the laser beam in the second direction with respect to the substrate satisfies the following equation:

$$V = \frac{C - \sqrt{C^2 + D^2} \cdot \cos(\alpha + \theta)}{\frac{D}{A \times B}}$$

wherein C represents the length of the first side or the second side of the substrate and D represents the length of the third side or fourth side of the substrate, wherein $\alpha$ represents an angle which an oblique line of the substrate forms with respect to the first side of the substrate and $\theta$ represents an inclined angle which the first side of the substrate forms with respect to the laser beam, and wherein A represents a scan pitch SC [nm] of the laser beam and B represents a frequency of the laser beam.

11. The crystallization method of claim 10, further comprising repeating the first moving and second moving until the amorphous silicon layer is substantially completely crystallized.

12. The crystallization method of claim 10, wherein the second moving is substantially continuously performed with respect to the first moving.

13. The crystallization method of claim 10, wherein the first moving and second moving are performed in a stepwise manner.

14. The crystallization method of claim 10, wherein both of the laser beam and substrate are moved in at least one of the first and second moving.

* * * * *